(12) United States Patent
Kitamura

(10) Patent No.: US 10,512,155 B2
(45) Date of Patent: Dec. 17, 2019

(54) WIRING BOARD, OPTICAL SEMICONDUCTOR ELEMENT PACKAGE, AND OPTICAL SEMICONDUCTOR DEVICE

(71) Applicant: KYOCERA Corporation, Kyoto-shi, Kyoto (JP)

(72) Inventor: Toshihiko Kitamura, Omihachiman (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/768,059

(22) PCT Filed: Jan. 26, 2017

(86) PCT No.: PCT/JP2017/002745
§ 371 (c)(1),
(2) Date: Apr. 13, 2018

(87) PCT Pub. No.: WO2017/131092
PCT Pub. Date: Aug. 3, 2017

(65) Prior Publication Data
US 2018/0352648 A1    Dec. 6, 2018

(30) Foreign Application Priority Data

Jan. 27, 2016 (JP) ................................. 2016-012943

(51) Int. Cl.
*H05K 1/02* (2006.01)
*H01L 23/02* (2006.01)
(Continued)

(52) U.S. Cl.
CPC .......... *H05K 1/0245* (2013.01); *H01L 23/02* (2013.01); *H01L 23/04* (2013.01); *H01L 23/12* (2013.01);
(Continued)

(58) Field of Classification Search
None
See application file for complete search history.

(56) References Cited

U.S. PATENT DOCUMENTS 4,972,050 A * 11/1990 Hammond ............. H05K 1/113
174/251
5,311,406 A * 5/1994 Snodgrass ............. H01L 23/145
257/E23.007

(Continued)

FOREIGN PATENT DOCUMENTS

JP    2003-249596 A    9/2003
JP    2009-158511 A    7/2009
(Continued)

*Primary Examiner* — Dimary S Lopez Cruz
*Assistant Examiner* — Muhammed Azam
(74) *Attorney, Agent, or Firm* — Volpe and Koenig, P.C.

(57) ABSTRACT

A wiring board that includes a first dielectric layer having a rectangular plate form, a ground conductor wiring, a pair of signal conductor wirings, a ground conductor layer, and a second dielectric layer having a rectangular plate form. The ground conductor wiring is positioned on a first face of the first dielectric layer. The pair of signal conductor wirings carrying out signal transmission is positioned on the first face of the first dielectric layer. The ground conductor layer is positioned on a second face of the first dielectric layer. A first end portion of the signal conductor wiring extends to a first side of the first face. The region of the ground conductor layer where the first end portion of the signal conductor wiring is positioned in plan view is cut away inwardly from a first side of the second face opposing the first side of the first face.

6 Claims, 11 Drawing Sheets

(51) Int. Cl.
*H01L 23/04* (2006.01)
*H01L 23/12* (2006.01)
*H01L 31/02* (2006.01)
*H01S 5/022* (2006.01)
*H05K 1/03* (2006.01)
*H05K 3/12* (2006.01)

(52) U.S. Cl.
CPC .............. *H01L 31/02* (2013.01); *H01S 5/022* (2013.01); *H01S 5/02212* (2013.01); *H01S 5/02276* (2013.01); *H05K 1/024* (2013.01); *H01L 2224/48091* (2013.01); *H05K 1/0306* (2013.01); *H05K 3/1216* (2013.01); *H05K 2201/068* (2013.01); *H05K 2201/093* (2013.01); *H05K 2201/09154* (2013.01); *H05K 2201/10121* (2013.01); *H05K 2201/10287* (2013.01); *H05K 2201/10424* (2013.01); *H05K 2203/1131* (2013.01)

(56) References Cited

U.S. PATENT DOCUMENTS

| | | | | |
|---|---|---|---|---|
| 5,374,819 A * | 12/1994 | Kim | ............... | G11B 7/1362 250/201.5 |
| 5,581,523 A * | 12/1996 | Seki | ............... | G11B 7/12 369/112.12 |
| 5,748,006 A * | 5/1998 | Sano | ............... | G01R 1/06772 324/754.07 |
| 6,220,765 B1 * | 4/2001 | Tatoh | ............... | H01L 31/0203 257/E31.117 |
| 7,039,083 B2 * | 5/2006 | Carroll | ............... | H01S 5/02212 372/34 |
| 7,525,816 B2 * | 4/2009 | Sawachi | ............... | H05K 1/0212 174/250 |
| 7,804,867 B2 * | 9/2010 | Scofet | ............... | H01S 5/02469 257/675 |
| 8,498,504 B2 * | 7/2013 | Matsubara | ............... | G02B 6/4214 385/14 |
| 8,908,728 B1 * | 12/2014 | Huikai | ............... | H01S 5/02415 372/34 |
| 8,989,531 B2 * | 3/2015 | Maetani | ............... | G02B 6/43 385/131 |
| 9,110,234 B2 * | 8/2015 | Terada | ............... | G02B 6/43 |
| 9,609,743 B2 * | 3/2017 | Funahashi | ............... | H01L 27/14618 |
| 9,655,233 B2 * | 5/2017 | Nakagawa | ............... | H05K 1/0245 |
| 9,825,388 B2 * | 11/2017 | Chou | ............... | H01R 13/6471 |
| 10,159,146 B2 * | 12/2018 | Tsurusaki | ............... | G06F 1/1643 |
| 2003/0147227 A1 * | 8/2003 | Egitto | ............... | H01L 21/4853 361/795 |
| 2004/0081410 A1 * | 4/2004 | Aronson | ............... | H01S 5/02212 385/92 |
| 2004/0208211 A1 * | 10/2004 | Maruyama | ............... | H01S 5/02212 372/38.1 |
| 2004/0247004 A1 * | 12/2004 | Keh | ............... | H01S 5/02212 372/36 |
| 2004/0264882 A1 * | 12/2004 | Torigoe | ............... | G02B 6/4201 385/88 |
| 2005/0100293 A1 * | 5/2005 | Warashina | ............... | H01L 25/167 385/92 |
| 2006/0118331 A1 * | 6/2006 | Nelson | ............... | H05K 3/242 174/261 |
| 2006/0133819 A1 * | 6/2006 | Yu | ............... | H04B 10/501 398/164 |
| 2007/0015380 A1 * | 1/2007 | Aronson | ............... | H01R 23/688 439/67 |
| 2007/0102830 A1 * | 5/2007 | Muto | ............... | H05K 1/0219 257/784 |
| 2007/0210400 A1 * | 9/2007 | Moribayashi | ............... | G02B 6/4214 257/440 |
| 2008/0029476 A1 * | 2/2008 | Ohmi | ............... | H05K 1/0216 216/13 |
| 2009/0129783 A1 * | 5/2009 | Ori | ............... | G02B 6/4246 398/136 |
| 2009/0286342 A1 * | 11/2009 | Takahashi | ............... | B82Y 20/00 438/32 |
| 2010/0215313 A1 * | 8/2010 | Matsuoka | ............... | G02B 6/43 385/14 |
| 2013/0108210 A1 * | 5/2013 | Uemura | ............... | G02B 6/43 385/14 |
| 2013/0128489 A1 * | 5/2013 | Satake | ............... | H01L 23/057 361/820 |
| 2013/0223034 A1 * | 8/2013 | Rathburn | ............... | H01L 23/5383 361/767 |
| 2013/0235545 A1 * | 9/2013 | Ohmi | ............... | H01L 23/49894 361/783 |
| 2014/0147128 A1 * | 5/2014 | Han | ............... | H05K 1/0251 398/135 |
| 2014/0204548 A1 * | 7/2014 | Sekine | ............... | H05K 1/162 361/761 |
| 2015/0181728 A1 * | 6/2015 | Tanaka | ............... | H01L 23/057 361/820 |
| 2015/0195935 A1 * | 7/2015 | Shibayama | ............... | H01L 23/053 361/807 |
| 2016/0240494 A1 | 8/2016 | Kim | | |
| 2017/0069556 A1 * | 3/2017 | Kawazu | ............... | H01L 23/057 |
| 2017/0131495 A1 * | 5/2017 | Shimakura | ............... | G02B 6/4277 |
| 2018/0130718 A1 * | 5/2018 | Kawazu | ............... | H01L 23/04 |
| 2018/0352648 A1 * | 12/2018 | Kitamura | ............... | H01L 23/02 |

FOREIGN PATENT DOCUMENTS

| | | |
|---|---|---|
| JP | 2012-222079 A | 11/2012 |
| WO | 2014/192687 A1 | 12/2014 |

* cited by examiner

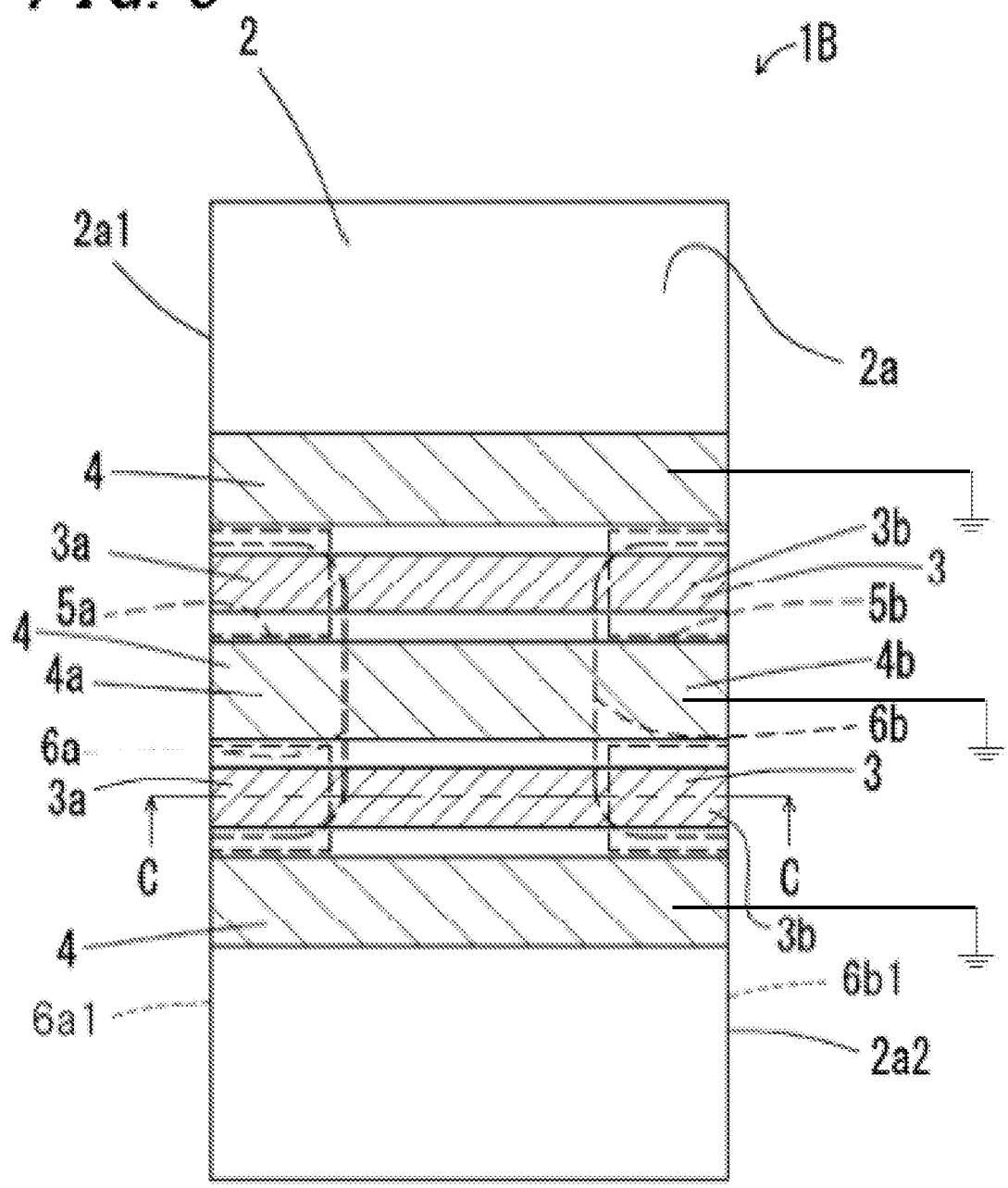

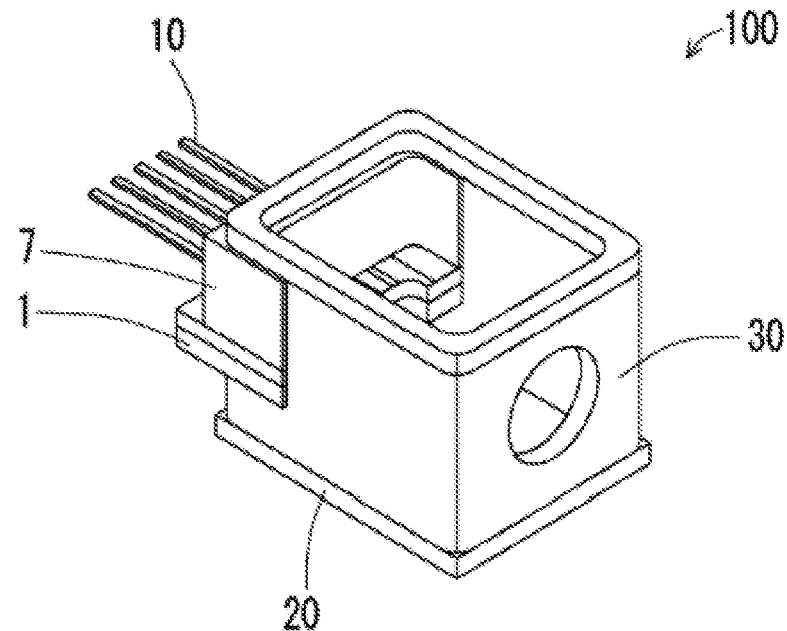
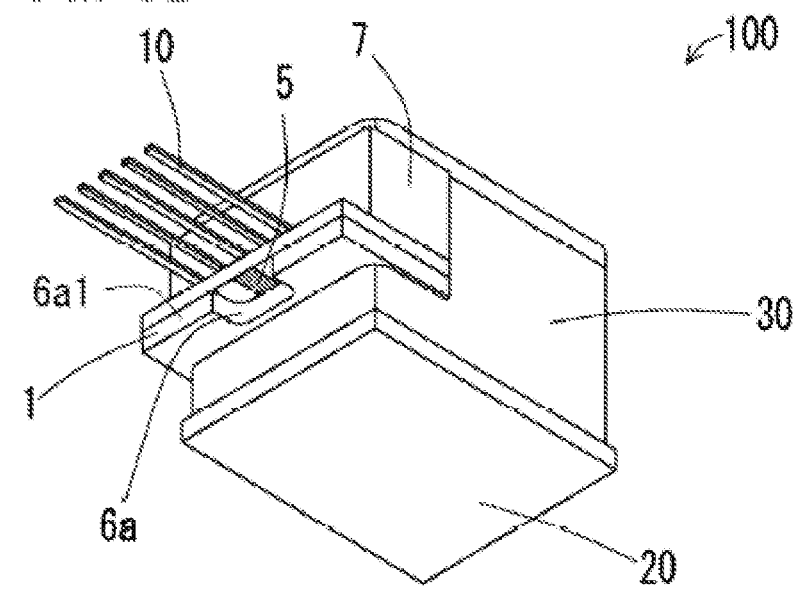

WIRING BOARD, OPTICAL SEMICONDUCTOR ELEMENT PACKAGE, AND OPTICAL SEMICONDUCTOR DEVICE

TECHNICAL FIELD

The present invention relates to a wiring board which transmits a high frequency signal, an optical semiconductor element package including the wiring board, and an optical semiconductor device.

BACKGROUND ART

An optical semiconductor element such as a light emitting element or a light receiving element, or a semiconductor element such as a signal processing arithmetic element is housed in a semiconductor element package in order to protect the semiconductor element, and to connect the semiconductor element and external wiring.

A package described in Patent Literature 1 includes a terminal structural body for signal transmission and a receptacle body which supports the terminal structural body. The terminal structural body is configured so that an upper face signal conductor layer and an upper face ground conductor layer are formed on an upper face of a terminal block formed of a dielectric material, a lower face ground conductor layer is formed on a lower face of the terminal block, and a side face signal conductor layer and a side face ground conductor layer are formed on a side face of the terminal block. The lower face ground conductor layer has a non-forming region corresponding to the side face signal conductor layer, and a dielectric layer provided on the lower face of the terminal block has a non-forming portion corresponding to the non-forming region.

CITATION LIST

Patent Literature

Patent Literature 1: Japanese Unexamined Patent Publication JP-A 2012-222079

SUMMARY OF INVENTION

A wiring board of one aspect of the invention includes a first dielectric layer having a rectangular plate form; a ground conductor wiring which is positioned on a first face of the first dielectric layer and is connected to a ground potential, a first end portion of the ground conductor wiring extending to a first side of the first face; a pair of signal conductor wirings which is positioned on the first face of the first dielectric layer and carries out signal transmission, the pair of signal conductor wirings being positioned along the ground conductor wiring keeping a predetermined distance from the ground conductor wiring on both sides in a width direction of the ground conductor wiring, first end portions of the pair of signal conductor wirings extending to the first side of the first face; a ground conductor layer which is positioned on a second face of the first dielectric layer and is connected to a ground potential, a region of the ground conductor layer where the first end portions of the pair of signal conductor wirings are positioned in plan view being cut away inwardly from a first side of the second face opposing the first side of the first face; and a second dielectric layer having a rectangular plate form, the second dielectric layer being positioned on a side of the ground conductor layer opposite to the first dielectric layer.

Also, an optical semiconductor element package of one aspect of the invention includes a plate-form base having an upper face including a mounting region where an optical semiconductor element is mounted; a frame member disposed on the upper face so as to surround the mounting region, and the wiring board mentioned above, the wiring board penetrating the frame member so that the first end portions of the pair of signal conductor wirings are disposed on an exterior of the frame member.

Further, an optical semiconductor device of one aspect of the invention includes the optical semiconductor element package mentioned above; an optical semiconductor element mounted in the mounting region; and a connection member electrically connecting the pair of signal conductor wirings and the optical semiconductor element.

BRIEF DESCRIPTION OF DRAWINGS

FIG. 6 is a plan view showing a wiring board 1B according to another embodiment of the invention;

FIGS. 8A and 8B are perspective views showing an optical semiconductor element package 100 including the wiring board 1;

DESCRIPTION OF EMBODIMENTS

Figure 1:
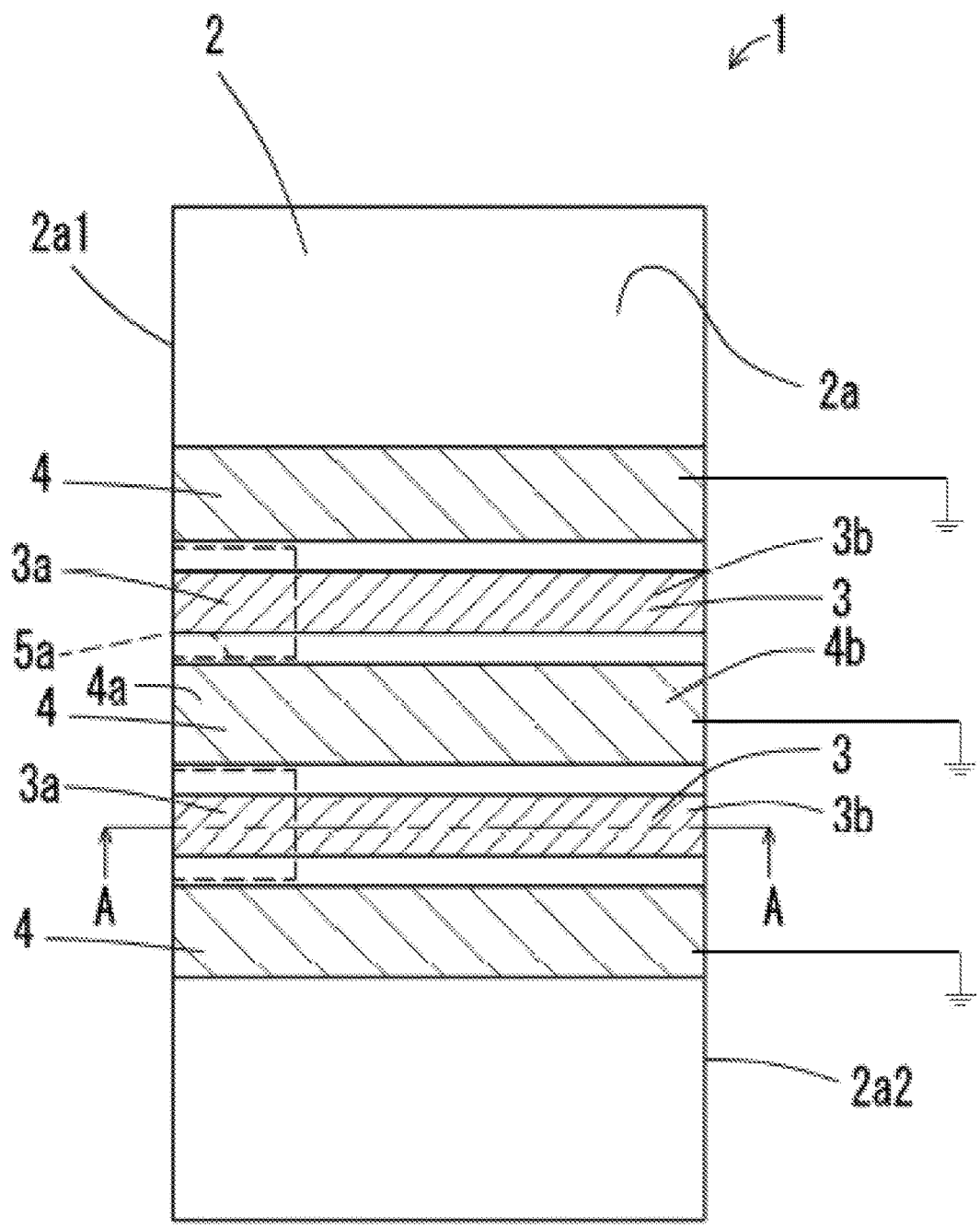
FIG. 1 is a plan view showing a wiring board 1 according to an embodiment of the invention.
Figure 2:
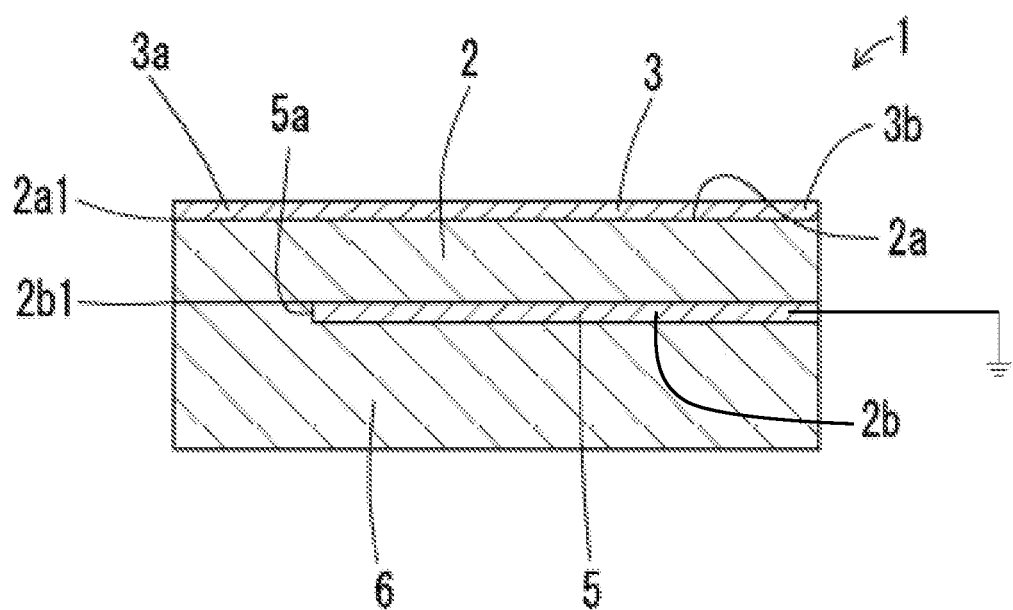
FIG. 2 is a sectional view of the wiring board 1 along the line A-A of FIG. 1.

FIG. 1 is a plan view showing a wiring board 1 according to an embodiment of the invention. FIG. 2 is a sectional view of the wiring board 1 along the line A-A of FIG. 1. The wiring board 1 includes a first dielectric layer 2, a pair of signal conductor wirings 3 and 3, a ground conductor wiring 4, a ground conductor layer 5, and a second dielectric layer 6.

The first dielectric layer 2 is a dielectric layer which is formed of a dielectric layer and has a rectangular plate form. The pair of signal conductor wirings 3 and 3, which carries out signal transmission, and the ground conductor wiring 4, which is connected to a ground potential, are provided on a first face 2a of the first dielectric layer 2.

As the dielectric material, for example, a ceramic material such as an aluminum oxide sintered body, a mullite sintered body, a silicon carbide sintered body, an aluminum nitride sintered body, or a silicon nitride sintered body, or a glass ceramic material, can be used.

In the present embodiment, three ground conductor wirings 4 are provided, wherein one linear ground conductor wiring 4 is positioned in a center of the first face 2a of the first dielectric layer 2. The pair of linear signal conductor wirings 3 and 3 are provided on both sides in a width direction (a direction perpendicular to a longitudinal direction) of the central ground conductor wiring 4, along the ground conductor wiring 4 keeping a predetermined distance from the ground conductor wiring 4. A first end portion 4a of the ground conductor wiring 4 extends to a first side 2a1 of the first face 2a of the first dielectric layer 2. A second end portion 4b of the ground conductor wiring 4 may be positioned in any way, but in the present embodiment, the second end portion 4b extends to a second side (an outer side of the first face opposing the first side 2a1) 2a2 of the first face 2a of the first dielectric layer 2. Also, in the present embodiment, the linear ground conductor wiring 4 is provided on outer sides of the pair of signal conductor wirings 3 and 3 keeping a predetermined distance in each case.

In the present embodiment, the pair of signal conductor wirings 3 and 3 are configured so that each of first end portions 3a and 3a extends to the first side 2a1 of the first face 2a of the first dielectric layer 2. Also, as described above, the pair of signal conductor wirings 3 and 3 are provided along the ground conductor wiring 4 keeping a predetermined distance from the ground conductor wiring 4. Each of second end portions 3b and 3b of the pair of signal conductor wirings 3 and 3 may be positioned in any way. In the present embodiment, each of the second end portions 3b and 3b of the pair of signal conductor wirings 3 and 3 is provided along the ground conductor wiring 4 keeping a predetermined distance from the ground conductor wiring 4, and extends to the second side 2a2 of the first face 2a of the first dielectric layer 2, in the same way as above.

In the present embodiment, the signal conductor wiring 3 and the ground conductor wiring 4 are both of linear form. Not being limited to this, the signal conductor wiring 3 and the ground conductor wiring 4 may comprise a curved portion, or part of a width thereof may be wider or narrower. Also, distances between the signal conductor wirings 3 and the ground conductor wirings 4 may be partially wider or narrower.

The ground conductor layer 5 is a solid layer which is provided on a second face 2b of the first dielectric layer 2 and is connected to a ground potential. A first non-forming region 5a, which is cut away toward an interior of the ground conductor layer 5 from a first side 2b1 side of the second face 2b opposing the first side 2a1 of the first face 2a of the first dielectric layer 2, is provided in the ground conductor layer 5. The first non-forming region 5a is provided in a region where the first end portion 3a of the signal conductor wiring 3 is positioned in plan view. That is, the ground conductor layer 5 is not partially formed in a position of the second face 2b opposing the first end portion 3a of the signal conductor wiring 3 in a thickness direction of the first dielectric layer 2, and a dielectric material constituting the first dielectric layer 2 or the second dielectric layer 6 is disposed in the position.

When a high frequency electrical signal (hereafter also referred to as a high frequency signal) is transmitted, the signal conductor wiring 3 is coupled so that an electromagnetic field is distributed between the signal conductor wiring 3 and the ground conductor wiring 4 neighboring on the first face 2a, and is coupled across the first dielectric layer 2 so that an electromagnetic field is also distributed between the signal conductor wiring 3 and the ground conductor layer 5 on the second face 2b. Characteristic impedance of the signal conductor wiring 3 is determined by an inductance component of the wiring, and by a capacitance component caused by electrostatic coupling between the signal conductor wiring 3 and the ground conductor wiring 4 and between the signal conductor wiring 3 and the ground conductor layer 5. In particular, the first end portion 3a of the signal conductor wiring 3 is positioned in an end portion of the first dielectric layer 2, and therefore the first end portion 3a of the signal conductor wiring 3 is easily electrostatically coupled to, for example, a conductor, such as an external mounting substrate, solder, or a connection terminal, disposed in a periphery of the first end portion 3a of the signal conductor wiring 3 and electrically connected to the wiring board 1, and the capacitance component is liable to fluctuate, whereby the characteristic impedance is liable to fluctuate. Furthermore, a lead terminal (to be described hereafter) is connected to the first end portion 3a of the signal conductor wiring 3 via a conductor such as a brazing material or solder, whereby the characteristic impedance is more liable to fluctuate. Whereby, return loss when a high frequency signal is transmitted occurs in the first end portion 3a of the signal conductor wiring 3, insertion loss increases, and high frequency signal transmission loss increases.

In the present embodiment, as described above, the first non-forming region 5a is provided in a portion of the ground conductor layer 5 opposing the first end portion 3a of the signal conductor wiring 3. Whereby, the capacitance component of the first end portion 3a is reduced, and a decrease of the characteristic impedance can be limited, and the capacitance component can easily be regulated to an arbitrary value, and a desired characteristic impedance is easily achieved. Accordingly, return loss when a high frequency signal is transmitted in the first end portion 3a, and insertion loss, are reduced, and high frequency signal transmission loss can be reduced.

In the present embodiment, a shape of the first non-forming region 5a is rectangular in plan view. Also, the first non-forming region 5a has a width (a width in a direction perpendicular to a direction in which a high frequency signal is transmitted through the signal conductor wiring 3) greater than the first end portion 3a in plan view, but is provided so as not to overlap the adjacent ground conductor wirings 4. Whereby, the ground conductor layer 5 can reduce a spread of a distribution of an electromagnetic field in the periphery of the first end portion 3a, and therefore return loss and insertion loss occurring when a high frequency signal is transmitted through the first end portion 3a can be reduced. In the present embodiment, one first non-forming region 5a is provided in the ground conductor layer 5 opposing the first end portion 3a of one signal conductor wiring 3.

It is sufficient that the width of the first non-forming region 5a in the direction perpendicular to the direction in which a high frequency signal is transmitted through the signal conductor wiring 3, and a length of the first non-forming region 5a in the direction in which a high frequency signal is transmitted through the signal conductor wiring 3, are set as appropriate in accordance with the capacitance component wished to be reduced, as described above. For example, a comprehensive decision is made based on various kinds of parameters, such as a kind of dielectric material configuring the first dielectric layer 2, a thickness of the first dielectric layer 2, and a frequency of a high frequency signal transmitted through the signal conductor wiring 3. The width of the first non-forming region 5a in the direction perpendicular to the direction in which a high frequency signal is transmitted through the signal conductor wiring 3 is a width greater than the first end portion 3a in plan view, as described above, and may be provided so as not to overlap the adjacent ground conductor wirings 4. In this case, a deterioration of frequency characteristics in the first end portion 3a can be restricted.

Also, the shape of the first non-forming region 5a, not being limited to a rectangular form, may be a polygonal form, including a triangular form or a trapezoidal form, a semi-circular form, a semi-elliptical form, or the like.

The ground conductor layer 5 may be provided over the whole of the second face 2b of the first dielectric layer 2 except for the first non-forming region 5a, or may be provided in part of the second face 2b. When the ground conductor layer 5 is provided in part of the second face 2b, the ground conductor layer 5 is provided in at least such a region that all of the signal conductor wirings 3 and all of the ground conductor wirings 4 are included in plan view. In the present embodiment, the region is a region including the ground conductor wirings 4 positioned at either end (the outer sides of the pair of signal conductor wirings 3 and 3) in plan view, and the ground conductor layer 5 is not provided in a region lying outside the ground conductor wirings 4. Whereby, in the wiring board 1 of the present embodiment, it is possible to reduce thermal stress caused by a difference between thermal expansion coefficients of the first dielectric layer 2 and the ground conductor wiring 4, and a difference between thermal expansion coefficients of the first dielectric layer 2 and the ground conductor layer 5, occurring due to heat applied in a manufacturing process or when conducting an environmental test or a reliability test. Accordingly, warping and deformation of the wiring board 1 can be reduced.

The second dielectric layer 6 is formed of the same dielectric material as the first dielectric layer 2, and is a dielectric layer of a rectangular plate form provided on a side of the ground conductor layer 5 opposite to the first dielectric layer 2. In the wiring board 1 of the present embodiment, the second dielectric layer 6 is provided on the second face 2b of the first dielectric layer 2, whereby mechanical strength of the wiring board 1 increases. Also, whereby, it is possible to maintain insulation from an external mounting substrate on which the wiring board 1 is mounted.

In the present embodiment, an external form of the second dielectric layer 6 is the same as that of the first dielectric layer 2, and the second dielectric layer 6 is provided so that the external form coincides with that of the first dielectric layer 2 in plan view. Whereby, in the wiring board 1 of the present embodiment, it is possible to reduce thermal stress caused by a difference between thermal expansion coefficients of the first dielectric layer 2 and the ground conductor wiring 4, and a difference between thermal expansion coefficients of the first dielectric layer 2 and the ground conductor layer 5 and the second dielectric layer 6, occurring due to heat applied in a manufacturing process or when conducting an environmental test or a reliability test. Also, warping and deformation of the wiring board 1 can be reduced.

The external form of the second dielectric layer 6, not needing to be the same as that of the first dielectric layer 2, may be larger or smaller than that of the first dielectric layer 2. It is sufficient that the external form has such a size that covers the ground conductor layer 5.

The pair of signal conductor wirings 3 and 3, the ground conductor wiring 4, and the ground conductor layer 5 are formed of a metal material such as gold, silver, copper, nickel, tungsten, molybdenum, or manganese. These metal materials may be formed by co-firing or metal plating, in the form of a metallized layer, a plating layer, or the like, on the first face 2a or the second face 2b of the first dielectric layer 2. Also, the metal material may be fabricated by processing into a predetermined form, and joined with a joining material such as a brazing material to a plating layer provided on the first face 2a of the first dielectric layer 2, so is not limited to a metal material that can be co-fired with the first dielectric layer 2. For example, a metal material formed of iron, nickel, cobalt, chromium, or the like, or an alloy including these, may be processed into a predetermined form, and may be joined with a brazing material to a plating layer provided on the first face 2a of the first dielectric layer 2.

When the first dielectric layer 2 and the second dielectric layer 6 are formed of, for example, an aluminum oxide sintered body, the first dielectric layer 2 and the second dielectric layer 6 can be fabricated in the following way. Firstly, a plurality of ceramic green sheets of a rectangular sheet form are fabricated by a base material powder of aluminum oxide, silicon oxide, or the like, being shaped into sheet form together with an appropriate organic binder and organic solvent. Next, a layered body is fabricated by stacking the ceramic green sheets. Subsequently, the layered body is fired at a temperature of 1300 to 1600° C., whereby the first dielectric layer 2 and the second dielectric layer 6 can be fabricated. Plural layers of the ceramic green sheet are not necessarily stacked together. Only one layer may be provided unless there is impediment in terms of mechanical strength, or the like, as the first dielectric layer 2 and the second dielectric layer 6.

Also, when the first dielectric layer 2 and the second dielectric layer 6 are formed of an aluminum oxide sintered body, each of conductors wiring and conductor layers contains, for example, tungsten, and can be fabricated in the following way. A metal paste, which is fabricated by mixing tungsten powder with an organic solvent and an organic binder, is printed on a first face and a second face of a ceramic green sheet for forming the first dielectric layer 2 so as to form a predetermined pattern, using a method such as a screen printing method. Subsequently, a ceramic green sheet for forming the second dielectric layer 6 is placed on the ceramic green sheet for forming the first dielectric layer 2, and the ceramic green sheets and the metal paste are co-fired. The wiring board 1 can be formed using the above-described method.

Figure 3:
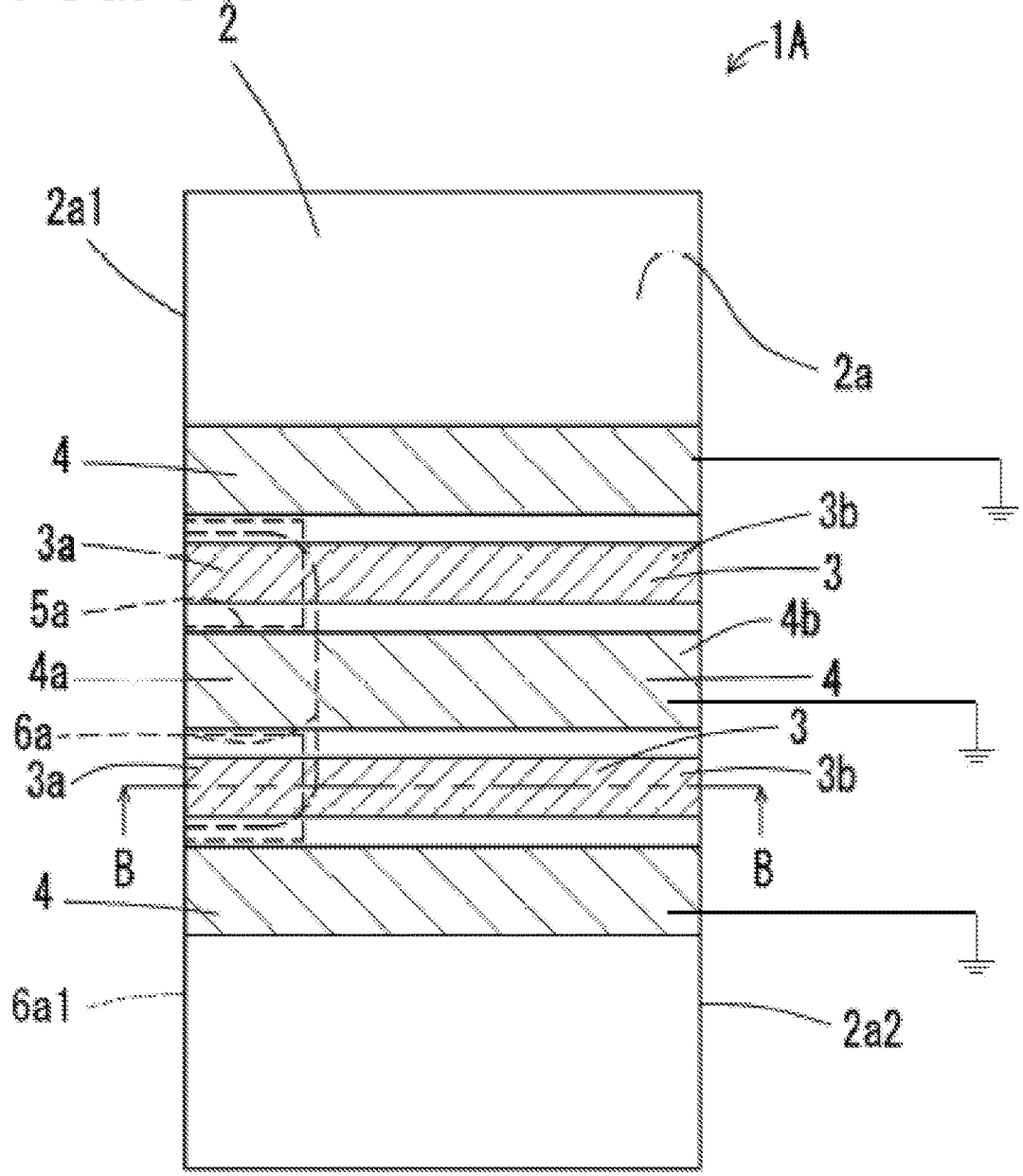
FIG. 3 is a plan view showing a wiring board 1A according to another embodiment of the invention.
Figure 4:
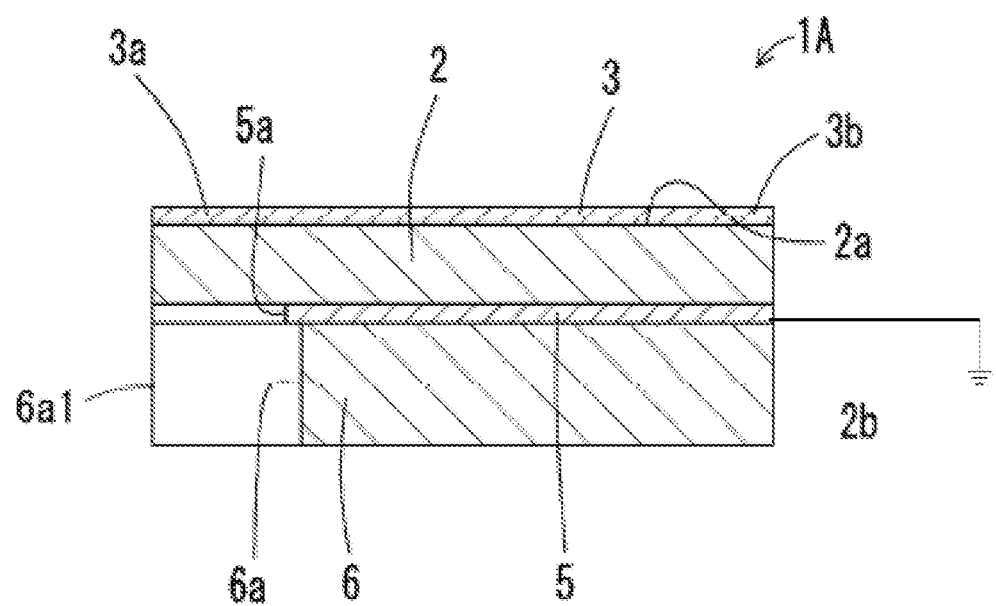
FIG. 4 is a sectional view of the wiring board 1A along the line B-B of FIG. 3.
Figure 5A:
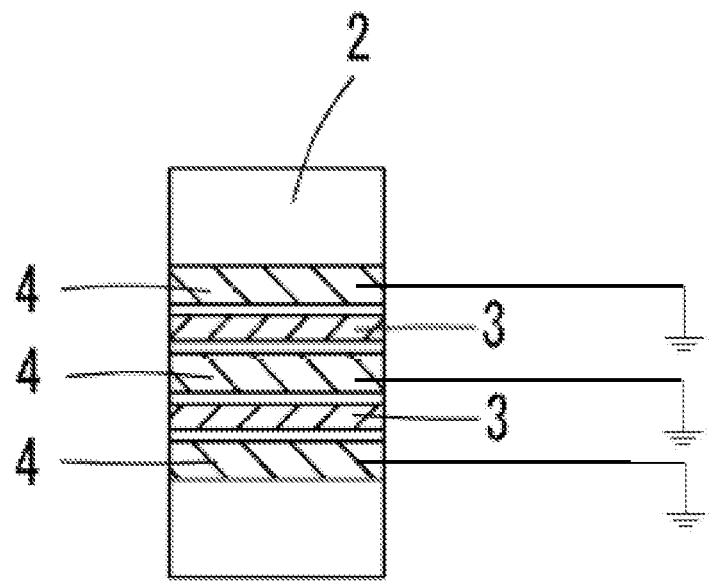
FIGS. 5A to 5C are plan views showing each layer of the wiring board 1A.
Figure 5B:
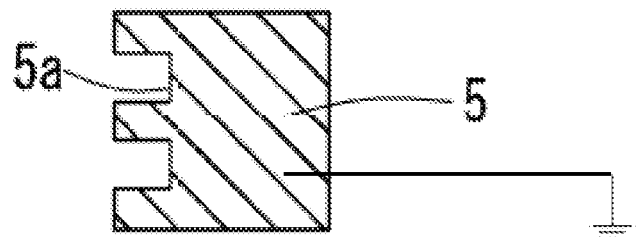
Figure 5C:
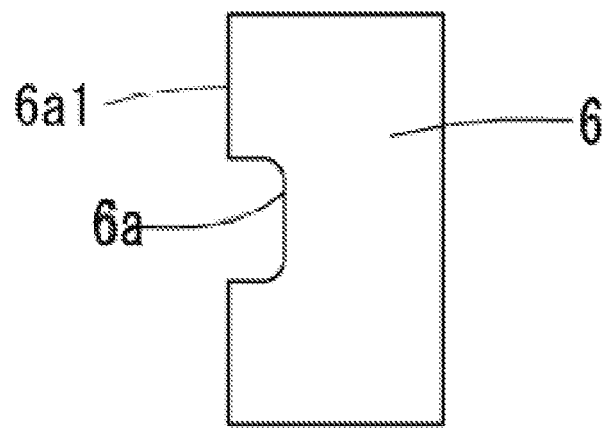

Next, another embodiment of the invention will be described. FIG. 3 is a plan view showing a wiring board 1A according to another embodiment of the invention. FIG. 4 is a sectional view of the wiring board 1A along the line B-B of FIG. 3. FIGS. 5A to 5C are plan views showing each layer of the wiring board 1A.

The wiring board 1A of the present embodiment differs from the wiring board 1 of the above-described embodiment only in that a cutaway portion 6a is provided in the second dielectric layer 6, and other configurations are the same. Hereinafter, the cutaway portion 6a provided in the second dielectric layer 6 will be described, while a description of other configurations will be omitted.

The second dielectric layer 6 is involved in the distribution of an electromagnetic field coupling the signal conductor wiring 3 and the ground conductor layer 5 when a high frequency signal is transmitted through the signal conductor wiring 3, and an effect is smaller than that of the first dielectric layer 2. However, coupling of the signal conductor wiring 3 and the ground conductor layer 5 is stronger owing to the second dielectric layer 6, and a capacitance component increases. As described above, the first end portion 3a of the signal conductor wiring 3 is electrostatically coupled to, for example, an external circuit substrate, or a conductor such as solder, or a connection terminal, disposed in a periphery of the first end portion 3a of the signal conductor wiring 3 and electrically connected to the wiring board 1, and furthermore, is coupled to a lead terminal connected to the first end portion 3a. Because of this, a capacitance component generated between the first end portion 3a of the signal conductor wiring 3 and the conductor increases, and the characteristic impedance of the first end portion 3a of the signal conductor wiring 3 decreases, and therefore the capacitance component of the first end portion 3a of the signal conductor wiring 3 may be reduced. In the present embodiment, the cutaway portion 6a is provided in the second dielectric layer 6 in order to reduce the capacitance component of the first end portion 3a of the signal conductor wiring 3. In order to reduce the capacitance component of the first end portion 3a of the signal conductor wiring 3, the distance between the signal conductor wiring 3 and the ground conductor wiring 4, or a distance between the signal conductor wiring 3 and the ground conductor layer 5, can be widened. In this case, however, a reduction in size and an integration of the wiring board 1A are difficult. Accordingly, in the present embodiment, the cutaway portion 6a is provided in the second dielectric layer 6 in order to reduce the capacitance component of the first end portion 3a of the signal conductor wiring 3. Consequently, a decrease of the characteristic impedance of the first end portion 3a of the signal conductor wiring 3 can be limited, the capacitance component is easily regulated to an arbitrary value, and a desired characteristic impedance is easily achieved. Furthermore, a reduction in size and an integration of the wiring board 1A can be realized.

The second dielectric layer 6 has a first side face 6a1 parallel with a plane including the first side 2a1 of the first face 2a and the first side 2b1 of the second face 2b of the first dielectric layer 2. The cutaway portion 6a is such a portion that a region of the second dielectric layer 6 where is positioned, in plan view, the first end portion 4a of the ground conductor wiring 4 sandwiched by the first end portion 3a of the signal conductor wiring 3 and the first end portion 3a of the signal conductor wiring 3 is cut away from the first side face 6a1 side. That is, the second dielectric layer 6 does not exist in a position directly below the first end portion 4a of the ground conductor wiring 4 sandwiched by the first end portion 3a of the signal conductor wiring 3 and the first end portion 3a of the signal conductor wiring 3. Whereby, the capacitance component of the first end portion 3a of the signal conductor wiring 3 is further reduced, and the characteristic impedance becoming smaller than a desired value can be limited, and the capacitance component can easily be regulated to an arbitrary value, and a desired characteristic impedance is easily achieved. Accordingly, transmission loss and return loss in the first end portion 3a of the signal conductor wiring 3 occurring when a high frequency signal is transmitted through the signal conductor wiring 3 can be further reduced.

Cutaway portions may be individually provided directly below the first end portion 3a of the signal conductor wiring 3 and directly below the first end portion 4a of the ground conductor wiring 4 sandwiched by the first end portions 3a of the signal conductor wirings 3, in the same way as the first non-forming region 5a provided in the ground conductor layer 5. In order to reduce a capacitance component generated due to a part of the second dielectric layer 6 remaining in an individual cutaway portion, and realize a reduction in size and an integration of the wiring board 1A, the following constitution may be adopted. That is, there may be provided one cutaway portion 6a including regions directly below the first end portion 3a of the signal conductor wiring 3 and directly below the first end portion 4a of the ground conductor wiring 4 sandwiched by the first end portions 3a of the signal conductor wirings 3. Also, when providing individual cutaway portions, there is also concern that a dielectric portion remaining between the individual cutaway portions will become chipped or cracked due to stress occurring in the wiring board 1A. The one cutaway portion 6a may be adopted to reduce this concern.

Furthermore, by adopting this kind of one cutaway portion 6a, such a configuration is obtained that the second dielectric layer 6 does not exist directly below the first end portion 4a of the ground conductor wiring 4 sandwiched by the first end portions 3a of the signal conductor wirings 3 either. Therefore, it is possible to reduce a capacitance component generated between, for example, a conductor disposed in the periphery of the first end portion 3a of the signal conductor wiring 3 and the ground conductor wiring 4 sandwiched by the first end portions 3a of the signal conductor wirings 3. Consequently, the characteristic impedance becoming smaller than a desired value can be limited, and the capacitance component is easily regulated to an arbitrary value, and a desired characteristic impedance is easily achieved. Furthermore, it is possible to reduce thermal stress generated in the cutaway portion 6a due to a difference between thermal expansion coefficients of the first dielectric layer 2 and the second dielectric layer 6, and a difference between thermal expansion coefficients of the first dielectric layer 2 and the ground conductor layer 5.

In the present embodiment, the cutaway portion 6a of the second dielectric layer 6 is a rectangular form in plan view, but a corner portion is a curved form (an R form). The second dielectric layer 6 is formed of, for example, a ceramic material, so when the corner portion has an acute angle, stress generated in the second dielectric layer 6 concentrates in the acutely angled corner portion when an external force is applied when using the wiring board 1A, and there is a possibility of cracking or the like occurring in the second dielectric layer 6. By providing the corner portion of the cutaway portion 6a with an R form, the possibility of an occurrence of cracking or the like due to a concentration of stress can be reduced.

Also, the form of the cutaway portion 6a, not being limited to a rectangular form, may be a polygonal form, including a triangular form or a trapezoidal form, a semicircular form, a semi-elliptical form, or the like. In the case of a polygonal form, a corner portion may be an R form, in the same way as in the case of a rectangular form.

Figure 7:
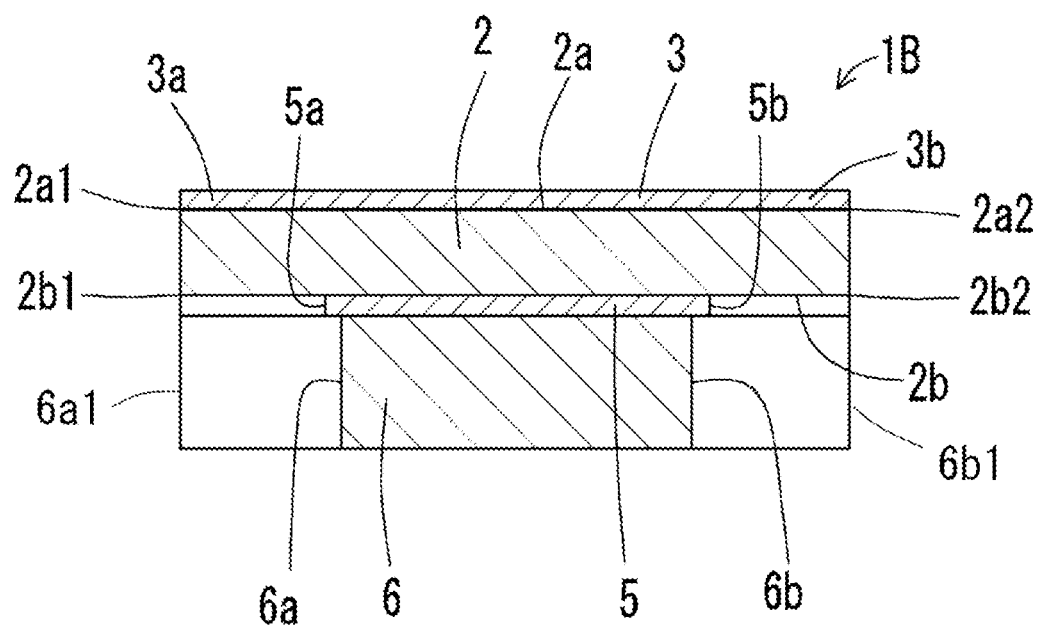
FIG. 7 is a sectional view of the wiring board 1B along the line C-C of FIG. 6.

Next, still another embodiment of the invention will be described. FIG. 6 is a plan view showing a wiring board 1B according to still another embodiment of the invention. FIG. 7 is a sectional view of the wiring board 1B along the line C-C of FIG. 6.

In the wiring board 1B of the present embodiment, in addition to the first non-forming region 5a and the cutaway portion 6a of the wiring board 1A, a second non-forming region 5b and a second cutaway portion 6b are further provided on a side opposite to the first non-forming region 5a and the cutaway portion 6a, in the ground conductor layer 5 and the second dielectric layer 6. The wiring board 1B differs from the wiring board 1A of the above-described embodiment only in this point, and other configurations are the same. Hereinafter, the second non-forming region 5b and the second cutaway portion 6b will be described, while a description of other configurations will be omitted.

With respect to the second non-forming region 5b provided in the ground conductor layer 5, a region of the ground conductor layer 5 where the second end portion 3b of the signal conductor wiring 3 is positioned in plan view is cut away inwardly from a second side 2b2 side of the second face 2b opposing the second side 2a2 of the first face 2a of the first dielectric layer 2. Also, the second dielectric layer 6 has a second side face 6b1 parallel with a plane including the second side 2a2 of the first face 2a and the second side 2b2 of the second face 2b of the first dielectric layer 2. With respect to the second cutaway portion 6b, a region of the second dielectric layer 6 where is positioned, in plan view, the second end portion 4b of the ground conductor wiring 4 sandwiched by the second end portion 3b of the signal conductor wiring 3 and the second end portion 3b of the signal conductor wiring 3 is cut away from the second side face 6b1 side.

That is, the ground conductor layer 5 is not partially formed in a position opposing the second end portion 3b of the signal conductor wiring 3 in the thickness direction of the first dielectric layer 2, and the second face 2b is exposed. Also, the second dielectric layer 6 does not exist in a position directly below the second end portion 4b of the ground conductor wiring 4 sandwiched by the second end portion 3b of the signal conductor wiring 3 and the second end portion 3b of the signal conductor wiring 3.

By providing the second non-forming region 5b and the second cutaway portion 6b in the ground conductor layer 5 and the second dielectric layer 6, respectively, the same advantages as from the first end portion 3a are obtained from the second end portion 3b of the signal conductor wiring 3. That is, the capacitance component of the second end portion 3b is reduced, and a decrease of the characteristic impedance can be limited, and the capacitance component is easily regulated to an arbitrary value, and a desired characteristic impedance is easily achieved. Accordingly, it is possible to reduce high frequency signal insertion loss and return loss in the second end portion 3b occurring when a high frequency signal is transmitted through the signal conductor wiring 3, and to improve frequency characteristics of the signal conductor wiring 3.

Next, an optical semiconductor element package 100 including the wiring board 1, and an optical semiconductor device 200 will be described.

Figure 9A:
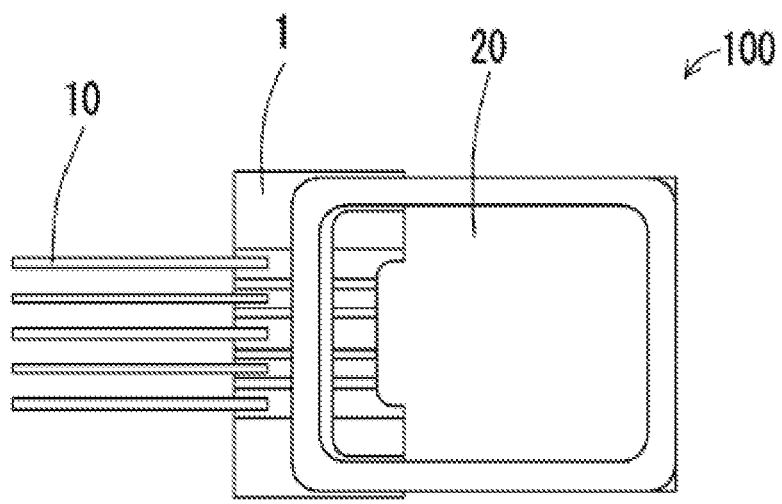
FIGS. 9A and 9B are plan views of the optical semiconductor element package 100.
Figure 9B:
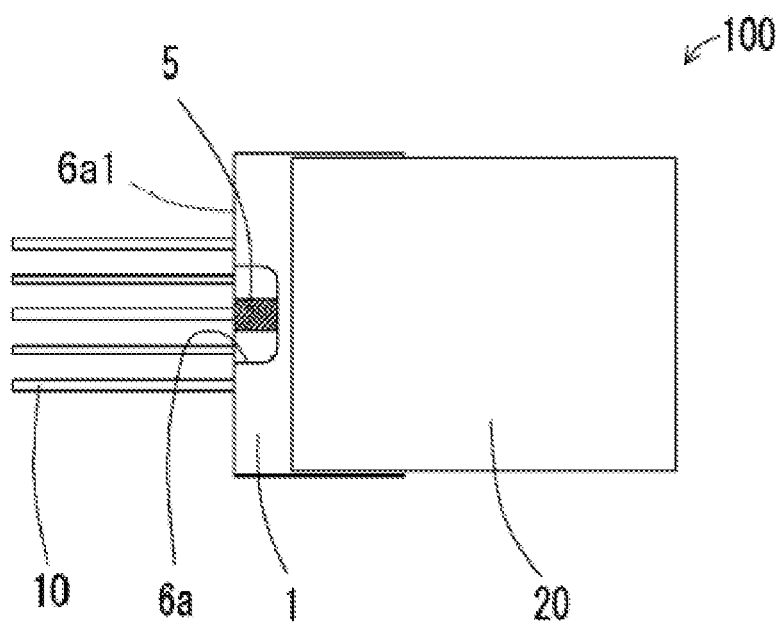
Figure 10:
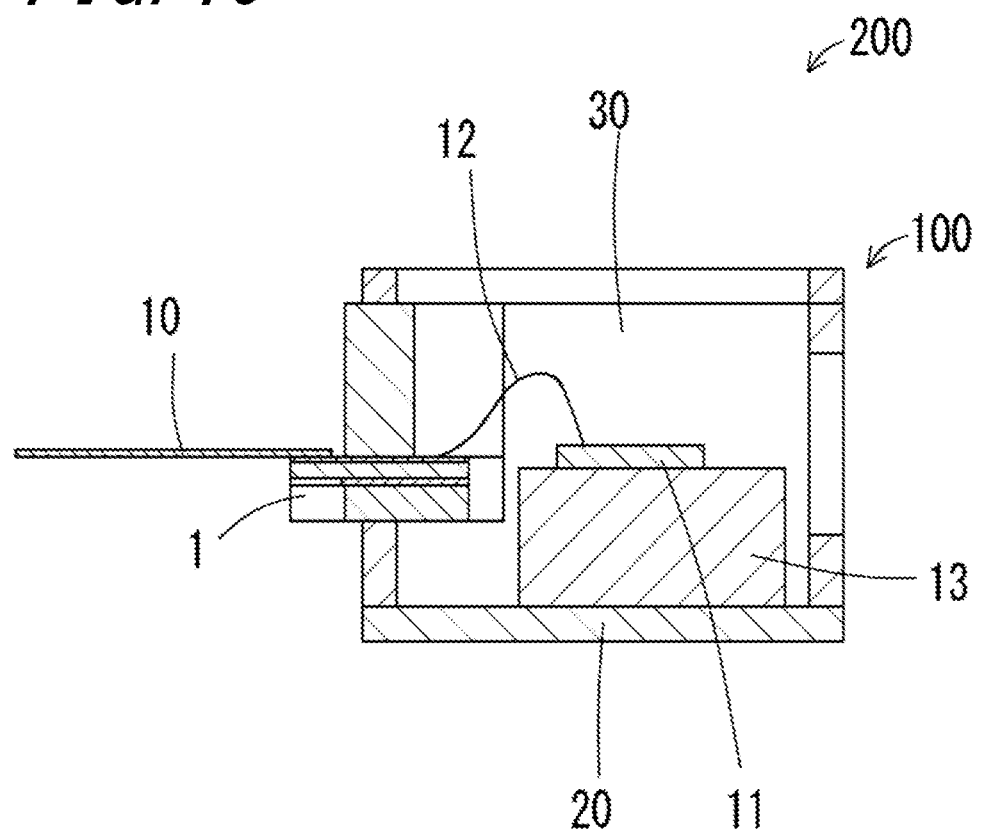
FIG. 10 is a sectional view showing an optical semiconductor device 200.

FIGS. 8A and 8B are perspective views showing the optical semiconductor element package 100 including the wiring board 1. FIGS. 9A and 9B are plan views of the optical semiconductor element package 100. FIG. 10 is a sectional view showing the optical semiconductor device 200.

The optical semiconductor element package 100 includes the wiring board 1, a base 20, and a frame member 30. A lead terminal 10 for a connection with an external circuit is connected to the signal conductor wiring 3 and the ground conductor wiring 4 of the wiring board 1. An optical semiconductor element 11 is housed in an interior of the optical semiconductor element package 100, and the optical semiconductor element package 100 constitutes the optical semiconductor device 200, which has a photoelectric conversion function.

In the present embodiment, the optical semiconductor element 11 housed in the optical semiconductor element package 100 is an LD (laser diode), which is a light emitting element.

The base 20 is formed in a rectangular plate form, and has on an upper face thereof a mounting region where the optical semiconductor element 11 can be mounted. The mounting region is a region for mounting the optical semiconductor element 11 housed in the optical semiconductor element package 100 across an insulating substrate, and fixing the optical semiconductor element 11 on the upper face of the base 20.

The base 20 of the present embodiment is fabricated from a metal member. Also, the base 20 is required to have a high insulation property at least in a portion of the mounting region where the optical semiconductor element 11 is mounted. Accordingly, such a configuration may be adopted that, for example, a mounting member 13 formed of an insulating substrate is disposed at least on the mounting region of the base 20. In particular, when high heat dissipation properties are required for the base 20, a metal member has high heat dissipation properties, and therefore the base 20 may have such a configuration. By adopting such a configuration that the mounting member 13 is disposed on the base 20, the heat dissipation properties of the base 20 can be increased.

As a material of the metal member, specifically, a metal such as iron, copper, nickel, chromium, cobalt, molybdenum, or tungsten can be used. Alternatively, as a material of the metal member, an alloy of these metals, such for example as a copper-tungsten alloy, a copper-molybdenum alloy, or an iron-nickel-cobalt alloy, can be used. The metal member constituting the base 20 can be fabricated by implementing a metal processing method, such as a rolling method or a punching method, on an ingot of this kind of metal material.

The separately fabricated mounting member 13 is joined onto the mounting region of the base 20 formed of the fabricated metal member with a joining material such as a brazing material.

Also, the base 20 of the present embodiment may be fabricated by stacking a plurality of insulating substrates. Further, the optical semiconductor element 11 is mounted in the mounting region of the base 20. As the insulating substrate, for example, it is possible to use a ceramic material such as an aluminum oxide sintered body, a mullite sintered body, a silicon carbide sintered body, an aluminum nitride sintered body, or a silicon nitride sintered body, or a glass ceramic material.

One example of a method of fabricating the base 20 will be described. A mixed member is fabricated by mixing a base material powder including a glass powder or a ceramic powder of the above-described materials, an organic solvent, and a binder. A plurality of ceramic green sheets are fabricated by shaping the mixed member into sheet form. A layered body is fabricated by stacking the plurality of ceramic green sheets fabricated. The layered body is fired at a temperature of approximately 1600° C., whereby the base 20 is fabricated. The base 20 is not limited to such a configuration that a plurality of insulating substrates are stacked. The base 20 may also be configured by one insulating substrate.

The frame member 30 is provided on the upper face of the base 20 so as to surround the mounting region of the base 20 in plan view. It is sufficient that the frame member 30 surround the mounting region, and the mounting region may be in a central portion, or may be in another portion, on an inner side of the frame member 30. Also, in the base 20 the upper face of the base 20 may be larger than the frame member 30 and may comprise a protruding portion in plan view, or the base 20 may have substantially the same external form as the frame member 30.

The frame member 30 is formed of a metal material wherein, for example, a metal member such as iron, copper, nickel, chromium, cobalt, or tungsten, or an alloy including these metals, can be used, in the same way as for the base 20. The frame member 30 formed of a metal member can be fabricated by applying a metal processing method, such as a cutting method, a molding method, or a punching method, to an ingot of such a metal member. Also, a ceramic material may be used as the frame member 30. Also, the frame member 30 may be formed of one kind of material, but such a structure may also be adopted that plural kinds of materials are stacked.

In the present embodiment, an optical semiconductor element is used, and therefore a through hole through which light is transmitted is provided in the frame member 30. An input end portion of an optical fiber may be inserted through the through hole, and light emitted from the optical semiconductor element 11 may be inputted into the optical fiber. Also, the input end portion of the optical fiber may be fixed outside the through hole, and light emitted from the optical semiconductor element 11 may be transmitted through the through hole, and may be inputted into the external optical fiber. An input and output of light may also be carried out through an upper aperture of the frame member 30. In this case, there is no need to provide a through hole in the frame member 30.

An elongate hole is provided in a side wall of the frame member 30. The wiring board 1 is provided penetrating the side wall of the frame member 30 so as to block the elongate hole. The wiring board 1 causes an electrical signal to be outputted from inside to outside, or inputted from outside to inside, the frame member 30. A third dielectric layer 7 is provided on an upper face of the wiring board 1 so that the signal conductor wiring 3 and a central portion of the ground conductor wiring 4 are sandwiched. Also, the first end portion 3a of the signal conductor wiring 3 is disposed on an exterior of the frame member 30, and the second end portion 3b of the signal conductor wiring 3 is disposed in an interior of the frame member 30. In order to adopt such a form, the optical semiconductor element package 100 of the present embodiment includes the third dielectric layer 7 formed of a U-form (a corner is right-angled) dielectric material following the external form of the frame member 30 in plan view. The second end portion 3b of the signal conductor wiring 3 disposed in the interior is electrically connected by a connection member inside the frame to the optical semiconductor element 11 mounted in the mounting region of the base 20. The first end portion 3a of the signal conductor wiring 3 is connected to the lead terminal 10, as described above.

The connection of the optical semiconductor element 11 and the wiring board 1 may be any kind of connection as long as an electrical signal can be transmitted. For example, the connection may be a connection using a bonding wire 12, which is a connection member, a flip-chip connection, a connection using an anisotropic conductive film (ACF), or the like.

The optical semiconductor element package 100 may include a lid member. The lid member is joined to an upper face of the frame member 30 using a joining material such as a brazing material. When assembling the optical semiconductor device 200, the optical semiconductor element 11 is mounted on the mounting region of the base 20 across the mounting member 13 and fixed to the base 20, and the optical semiconductor element 11 and the wiring board 1 are electrically connected to each other. Also, the optical fiber is fixed to the frame member 30 so that electrical signals can be outputted to and inputted from the optical semiconductor element 11. Subsequently, the lid member is fixed to the upper face of the frame member 30. The fixing of the lid member to the frame member 30 is carried out by, for example, seam welding.

It is sufficient that the lid member is such that moisture, minute particles, and the like do not enter an interior of the optical semiconductor device 200, and it is possible to use such a lid member that a metal material, a ceramic material, or the like, the same as that of the frame member 30 is processed and shaped into a plate form.

The optical semiconductor element 11 needs to be disposed on an optical axis of the optical fiber. Therefore, rather than mounting the optical semiconductor element 11 directly on the base 20, the mounting member 13 may be fixed to the mounting region of the base 20, and the optical semiconductor element 11 mounted across the mounting member 13, thereby facilitating positioning. It is sufficient that the mounting member 13 is of a material having insulating properties, and it is possible to use a ceramic material, or the like, the same as that of the insulating substrate described for the base 20.

Although the optical semiconductor device 200 has such a configuration that a light emitting element is housed as the optical semiconductor element 11, the optical semiconductor device of the invention is not limited to this, such a configuration may be that a PD (photodiode), which is a light receiving element, is housed as the optical semiconductor element 11.

A light receiving element which is the optical semiconductor element 11 receives light emitted from an optical fiber, and outputs an electrical signal in accordance with an amount of light received. The electrical signal is outputted to the exterior via the wiring board 1. An external control unit executes a process in accordance with the electrical signal outputted from the optical semiconductor device.

EXAMPLES

Taking the configuration of the wiring board 1 in FIG. 1 and FIG. 2 as Example 1, and the configuration of FIG. 3 and FIG. 4 as Example 2, a configuration such that, rather than providing the first non-forming region 5a in the ground conductor layer 5 of the wiring board 1, the ground conductor layer 5 exists directly below the first end portion 3a of the signal conductor wiring 3 as Comparative Example 1, return loss and insertion loss were evaluated by simulation.

An ANSYS HFSS manufactured by Cybernet Systems Co., Ltd. was used for the simulation. The thickness of the first dielectric layer 2 was set to 0.4 mm, the thickness of the second dielectric layer 6 was set to 0.5 mm, the width of the signal conductor wiring 3 was set to 0.35 mm, the width of the ground conductor wiring 4 sandwiched by the signal conductor wirings 3 was set to 0.57 mm, and the width of the ground conductor wiring 4 positioned at either end of the signal conductor wiring 3 was set to 0.535 mm. The width in a direction perpendicular to a transmission direction of a high frequency signal of the first non-forming region 5a provided so that a central axis corresponds to a central axis of the signal conductor wiring 3, with the wiring board 1 seen in plan view, was set to 0.7 mm, and the length in the transmission direction was set to 0.7 mm. The width in a direction perpendicular to a transmission direction of a high frequency signal of the cutaway portion 6a provided so that a central axis corresponds to a central axis of the ground conductor wiring 4 sandwiched by the signal conductor wirings 3 was set to 1.74 mm, and the length in the transmission direction was set to 0.8 mm. The configuration of the wiring board 1 in FIG. 1 and FIG. 2 was taken as Example 1. The configuration of FIG. 3 and FIG. 4 was taken as Example 2. Such a configuration that, rather than providing the first non-forming region 5a in the ground conductor layer 5 of the wiring board 1, the ground conductor layer 5 exists directly below the first end portion 3a of the signal conductor wiring 3 was taken as Comparative Example 1. Return loss and insertion loss were evaluated by electromagnetic field simulation in each example and comparative example.

Figure 11A:
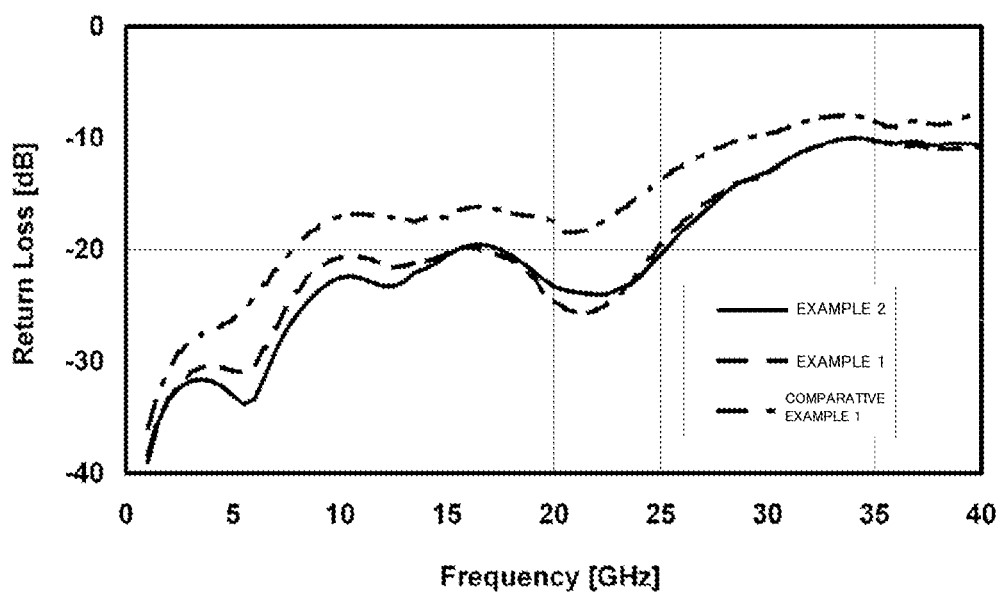
FIGS. 11A and 11B are graphs showing simulation results for return loss and insertion loss.
Figure 11B:
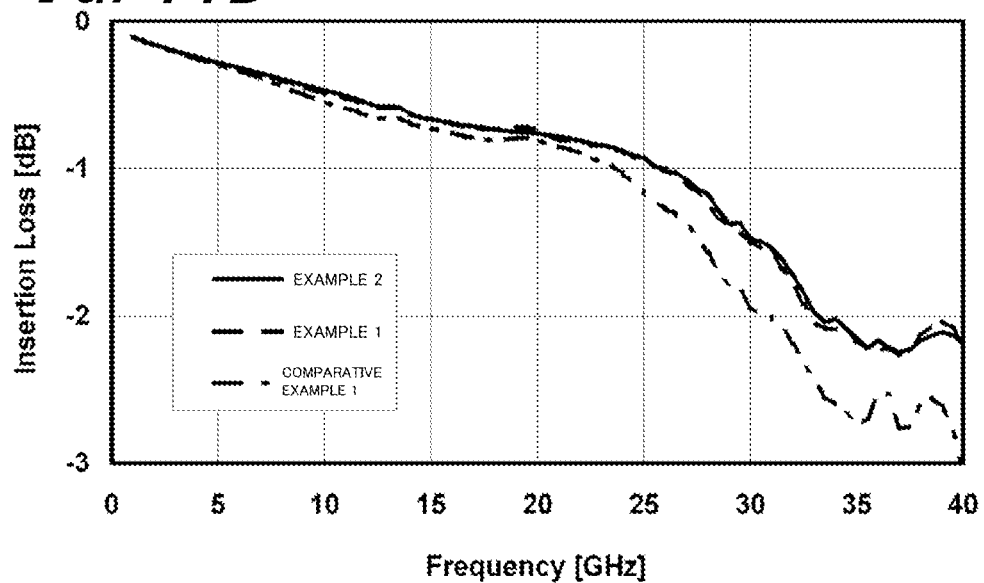

FIGS. 11A and 11B are graphs showing simulation results for return loss and insertion loss. FIG. 11A shows return loss, and FIG. 11B shows insertion loss. As far as a signal frequency of 15 GHz, return loss could be kept lower in Example 2 than in Example 1. When 15 GHz was exceeded, Example 1 and Example 2 showed substantially the same results. It was found that return loss was reduced further in both Examples 1 and 2 than in Comparative Example 1 over all the calculated frequencies.

Also, with regard to insertion loss, insertion loss was reduced further in both Examples 1 and 2 than in Comparative Example 1 over all the calculated frequencies, and Example 1 and Example 2 were substantially the same.

As can be seen from the above-described simulation results, by providing the first non-forming region 5a directly below the first end portion 3a of the signal conductor wiring 3 in the ground conductor layer 5, both return loss and insertion loss were reduced in comparison with Comparative Example 1 in which the first non-forming region 5a is not provided. Also, by further providing the cutaway portion 6a in the second dielectric layer 6, return loss and insertion loss could be further reduced at 15 GHz or less.

REFERENCE SIGNS LIST 1, 1A, 1B: Wiring board
2: First dielectric layer
2a: First face
2b: Second face
3: Signal conductor wiring
3a: First end portion
3b: Second end portion
4: Ground conductor wiring
4a: First end portion
4b: Second end portion
5: Ground conductor layer
5a, 5b: Non-forming region
6: Second dielectric layer
6a1: First side face
6b1: Second side face
6a, 6b: Cutaway portion
10: Lead terminal
11: Optical semiconductor element
12: Bonding wire
13: Mounting member
20: Base
2a1: First side
2a2: Second side
2b1: First side
2b2: Second side
30: Frame member
100: Optical semiconductor element package
200: Optical semiconductor device

The invention claimed is:

1. A wiring board, comprising:
a first dielectric layer having a rectangular plate form;
a ground conductor wiring which is positioned on a first face of the first dielectric layer and is connected to a ground potential, a first end portion of the ground conductor wiring extending to a first side of the first face;
a pair of signal conductor wirings which is positioned on the first face of the first dielectric layer and carries out signal transmission, the pair of signal conductor wirings being positioned along the ground conductor wiring keeping a predetermined distance from the ground conductor wiring on both sides in a width direction of the ground conductor wiring, first end portions of the pair of signal conductor wirings extending to the first side of the first face;
a ground conductor layer which is positioned on a second face of the first dielectric layer and is connected to the ground potential, a region of the ground conductor layer where the first end portions of the pair of signal conductor wirings are positioned in plan view being cut away inwardly from a first side of the second face opposing the first side of the first face; and
a second dielectric layer having a rectangular plate form, the second dielectric layer being positioned on a side of the ground conductor layer opposite to the first dielectric layer.

2. The wiring board according to claim 1, wherein the second dielectric layer has a first side face parallel to a plane including the first side of the first face and the first side of the second face of the first dielectric layer, and a region of the second dielectric layer where the first end portions of the pair of signal conductor wirings and the first end portion of the ground conductor wiring are positioned in plan view is cut away from a side of the first side face.

3. The wiring board according to claim 2, wherein a second end portions of the pair of signal conductor wirings extend to a second side of the first face opposing the first side,
a second end portion of the ground conductor wiring extends to the second side of the first face, and
a region of the ground conductor layer where the second end portions of the pair of signal conductor wirings are positioned in plan view is cut away inwardly from a second side of the second face opposing the second side of the first face.

4. The wiring board according to claim 3, wherein the second dielectric layer has a second side face parallel to a plane including the second side of the first face and the second side of the second face of the first dielectric layer, and a region of the second dielectric layer where the second end portions of the pair of signal conductor wirings and the second end portion of the ground conductor wiring are positioned in plan view is cut away from a side of the second side face.

5. An optical semiconductor element package, comprising:
a plate-form base having an upper face including a mounting region where an optical semiconductor element is mounted;
a frame member disposed on the upper face so as to surround the mounting region; and
the wiring board according to claim 1, the wiring board penetrating the frame member so that the first end portions of the pair of signal conductor wirings are disposed on an exterior of the frame member.

6. An optical semiconductor device, comprising:
the optical semiconductor element package according to claim 5;
an optical semiconductor element mounted in the mounting region; and
a connection member electrically connecting the pair of signal conductor wirings and the optical semiconductor element.

* * * * *